United States Patent [19]
Williams et al.

[11] Patent Number: 5,751,554
[45] Date of Patent: May 12, 1998

[54] TESTABLE CHIP CARRIER

[75] Inventors: Simon Mark Williams, Ayr; Michael Lawrence McGeary, Ayrshire, both of Scotland

[73] Assignee: Digital Equipment Corporation, Maynard, Mass.

[21] Appl. No.: 612,206

[22] Filed: Mar. 7, 1996

Related U.S. Application Data

[63] Continuation of Ser. No. 180,600, Jan. 13, 1994, abandoned.

[30] Foreign Application Priority Data

Jan. 19, 1993 [GB] United Kingdom ............... 9300951

[51] Int. Cl.[6] ................... H05K 7/02; H01R 9/00
[52] U.S. Cl. ............... 361/760; 361/709; 361/772; 361/774; 361/777; 174/260
[58] Field of Search ............... 361/760–764, 361/709, 714–715, 720–722, 772, 774, 777; 174/52.2, 52.3, 52.4, 250, 260–263

[56] References Cited

U.S. PATENT DOCUMENTS 4,598,337  7/1986  Wuthrich et al. .
4,922,324  5/1990  Sudo .
5,034,568  7/1991  Mather .................... 174/52.4
5,235,496  8/1993  Chomette et al. .......... 361/764

*Primary Examiner*—Bot L. Ledynh
*Attorney, Agent, or Firm*—Lindsay G. McGuinness; Denis G. Maloney; Arthur W. Fisher

[57] ABSTRACT

An integrated circuit handling, packaging and testing apparatus in the form of a testable chip carrier comprising a rigid substrate onto which a chip may be bonded, and which provides a high density interconnect pattern orthogonally aligned to the chip bond pads for wire bonding thereto. The interconnect also provides external bonding points patterned for similar orthogonal alignment to the external device to which the chip is to be connected, and the dimensions of the carrier are substantially smaller than an equivalent standard or custom package type. A hermetic or non-hermetic seal lidding operation may be carried out on the chip and carrier. The carrier also provides a detachable test perimeter allowing full-functional testing and burn-in of the attached wire-bonded chip prior to placement on a printed circuit board or multi-chip module. Signal integrity is improved by the exact alignment of the carrier-to-chip and carrier-to-external device connections, and manufacturing techniques allow for the use of optimum interconnect materials, multi-layer structures and the addition of passive components external to the chip. The carriers may be integrated with heatsinks.

18 Claims, 7 Drawing Sheets

1

TESTABLE CHIP CARRIER

This application is a continuation, of application Ser. No. 08/180,600, filed Jan. 13, 1994, now abandoned.

FIELD OF THE INVENTION

The present invention relates to integrated circuit handling, packaging and testing techniques, and in particular to a method and apparatus for the mounting of integrated circuit "chips" onto a substrate which provides for mechanical rigidity, full functional testability and burn-in of the chip, high packing density on a printed circuit board or multi-chip module, and high electrical performance characteristics.

Present techniques for the packaging of integrated circuits typically involve the use of two alternative types of package—hermetically sealed, high temperature co-fired ceramic packages for higher specification or higher power chips, and plastic encapsulated packages for lower pin-count and lower power chips. Additionally, some metal package types are used in high reliability and military applications.

A common feature of these packaging types is that they are usually designed and manufactured to industry standard specifications into which the chip must fit if low-cost devices are to be achieved. Alternatively, they may be custom built to suit a particular design of chip. The costs and lead-times associated with custom design of packages are such that this option may normally only be considered for very high volume, or very high value devices. The techniques used in the manufacture of ceramic packages (ie. those most likely to be relevant to high specification, high reliability devices) are such that only certain metal types may be used to form the interconnects in the package, ie. those which can withstand the high temperatures used for ceramic firing. The techniques used for interconnect formation also limit the design rules of these interconnects to typically 250 μm.

A development in chip packaging techniques is the use of multi-chip modules, where a suitable substrate such as ceramic- or laminate-based, is patterned using lithographic techniques with bonding points and inter-chip interconnect lines for a plurality of chips to be mounted on, and electrically connected to, the single substrate. This technique has clear advantages in the packing density which can be achieved, but disadvantages in that full functional testing and burn-in of each individual chip cannot readily be carried out, with consequent penalty on yield and/or rework rates.

A further development in chip packaging techniques is the use of a removable test perimeter connected to the suitable substrate upon which the chip is mounted, which may be removed by laser scribing techniques after the full-functional testing and burn-in of the chip residing thereon.

An important consideration in the packaging and testing of high-speed chips is the requirement that signal integrity during transfer on- and off-chip must be carefully controlled. Typically, wire bonding techniques from chip to package, or from chip to multi-chip module can cause problems in signal integrity, since the effective distance over which a signal must travel to off-chip connections is typically both long and variable in both standard and custom design packages with consequent effects on impedance. The choice of package interconnect material (typically tungsten in a ceramic package) and its resistivity also affects this signal integrity and the choice of this material may be strongly influenced by other factors, such as ability to withstand ceramic firing temperatures.

SUMMARY OF THE INVENTION

It is therefore an object of the present invention to provide a combined chip handling, packaging and testing technique which provides mechanical support and protection, full-functional testability and burn-in of the chip, high packing density on, for example, a printed circuit board or multi-chip module and improved electrical performance characteristics.

According to the present invention, there is provided a testable chip carrier as defined in the accompanying claims.

BRIEF DESCRIPTION OF THE DRAWING

Embodiments of the present invention will now be described by way of example, and with reference to the accompanying figures in which.

DESCRIPTION OF PREFERRED EMBODIMENTS

Figure 1:
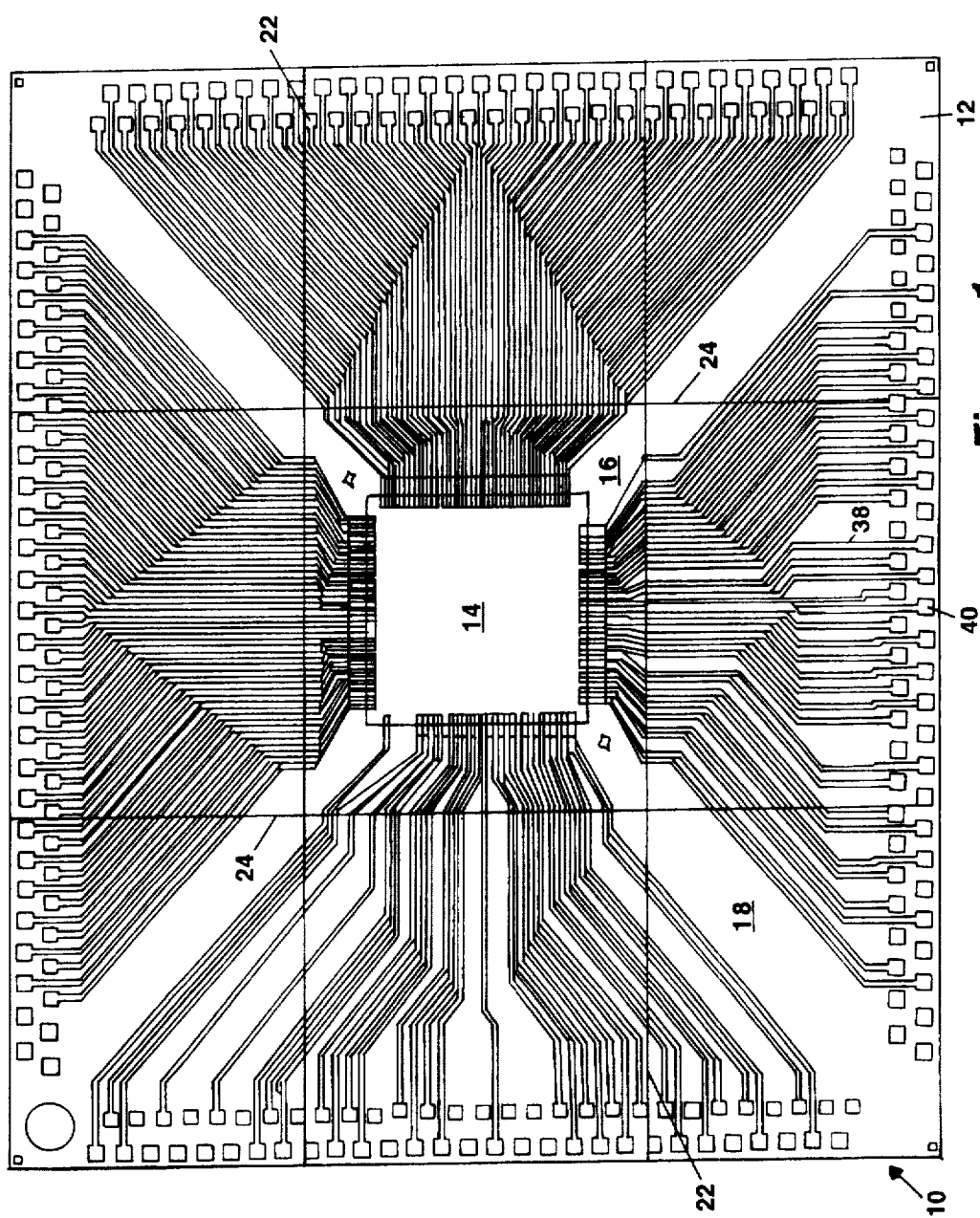
FIG. 1 shows a plan view of a testable chip carrier according to the present invention.
Figure 2:
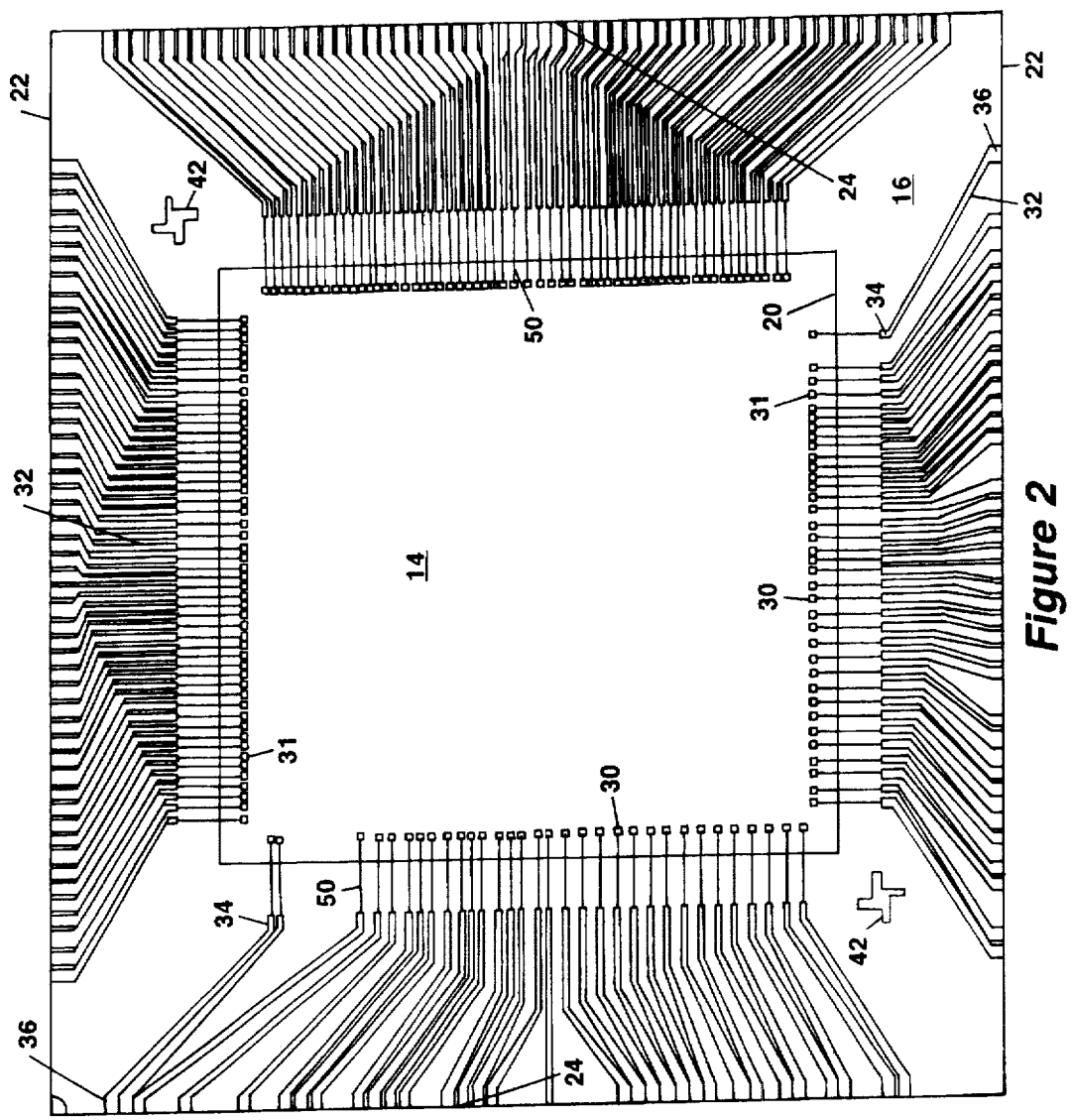
FIG. 2 shows a plan view of the testable chip carrier of FIG. 1 with the test perimeter thereof removed.

With reference to FIGS. 1 and 2 there is shown a testable chip carrier 10 according to one embodiment of the present invention. The testable chip carrier comprises a rigid substrate 12 formed of suitable electrically insulating material, such as ceramic, aluminium nitride, silicon dioxide, beryllium oxide or alternatively a laminated composite structure such as poly-silicon with an insulating layer of polyamide thereon. The substrate 12 is divided into free distinct portions. The innermost portion is a chip receiving area, occupied by chip 14 in position. This is bounded by an interconnect portion 16 extending outward from the edge or perimeter 20 of the chip 14 (FIG. 2) to a test perimeter 18 (FIG. 1). The separation of the interconnect portion 16 and the test perimeter 18 is defined by four intersecting scribe lines 22,24.

The chip 14 is characterised by a plurality of bonding pads 30, typically spaced around all four sides thereof. Such bonding pads 30 are normally all spaced at equal distance from the chip perimeter 20, but are not always spaced equidistant from adjacent bonding pads. They may also include bonding pads 31 of different sizes, as illustrated. An example of pad geometry is for bonding pads of 100 μm width and 50 μm minimum spacing between pads (ie. a minimum pitch of 150 μm).

The interconnect portion 16 includes a plurality of electrically conducting interconnect elements 32 deposited on the substrate 12 and each extending from an inner bonding area 34 at a position proximal to the chip bonding pads 30 outward to an outer bonding area 36 proximal to a scribe line 22 or 24. Electrical connections are made to the chip 14 by way of wire bonds 50 from bonding pads 30 to inner bonding areas 34, and also from outer bonding areas 36 to appropriate external electrical connections as will be described later.

Fiducial alignment aids 42 for chip attach and wire bond pattern recognition systems may also be patterned onto the substrate in the interconnect portion 16.

The test perimeter 18 comprises the eight outer sections shown in FIG. 1 bounded by the outer periphery of the substrate 12 and the scribe lines 22 and 24. The test perimeter carries further interconnect elements 38 deposited on the substrate 12 which each extend from a corresponding outer bonding area 36 on interconnect portion 16 to a test pad 40 on test perimeter 18.

It is a particular feature of the present invention that the interconnect elements 36,38 are defined on the substrate 12 using any fine line dielectric and conductor deposition techniques which are capable of resolving interconnect elements to a pitch at least as small as the closest pitch of the bonding pads 20 of the chip 14, such as those used in hybrid, thick film or thin film deposition techniques. This permits the inner bonding areas 34 to be located proximal to the chip perimeter 20 at such positions that they are in orthogonal alignment to each corresponding bonding pad 30 to which electrical connection win be made by a wire bond 50. Thus it can be observed, in particular from FIG. 2, that each wire bond 50 is of identical length to every other wire bond attached to chip 14. This results in substantial benefits in respect of signal integrity, since the signal path across the wire bond is identical in each case, and capacitive and inductive effects caused by dissimilar wire bond lengths are thereby eliminated.

The outer bonding areas 36 are also configured to exactly match the pattern of external connections to which the chip will eventually be connected, in analogous fashion to that described for wire bonds 50. For example, the external connections may be to a multi-chip module or directly onto printed circuit board. Thus wire bond connections 52 (shown in FIG. 3) from the outer bonding areas 36 to the external connections of the printed circuit board or multi-chip module are preferably also all of identical length. The interconnection portion 16 thereby acts as an interface to match the chip bond pad dimensions to the external electrical connections with minimal difference in electrical path length, and can also act as a supporting substrate for the chip. The contribution, impedance-wise, to this path length of the interconnect elements 32 is relatively small. Unlike ceramic package interconnects which must be chosen to withstand the rigours of ceramic firing processes, the thin or thick film deposition techniques used to form the interconnects 32 may be chosen to use high conductivity metals such as gold, silver, aluminium or copper. Thus the material used for the interconnect may also be chosen to allow for mono-metal interconnection strategies. Signal integrity may be further improved by the use of uniform track spacing on the chip carrier substrate, or by predetermining the characteristic impedance thereof to suit the external circuit.

The pitch of the interconnects is capable of matching the normal pitch of chip bond pads without difficulty. Fine line screen print processes with track widths down to 25 μm at 25 μm spacing—ie. 50 μm pitch—can be utilised where required.

A further major benefit of the testable chip carrier 10 is the ability to facilitate full-functional chip testing at final operating speeds before installation of the chip into the multi-chip module or onto the printed circuit board. This is achieved by the use of the detachable test perimeter 18. The substrate 12 may be formed with laser scribed pits in the underside thereof to form the scribe lines 22,24. Typically, for a substrate of 625 μm thickness, the laser scribed pits are formed to a depth of approximately one-third substrate thickness (~200 μm) with a similar dimension diameter of each pit. The test perimeter 18 is thus removable after chip testing by snapping the substrate along the scribe lines 22,24. Alternatively, perimeter removal can be performed after testable chip carrier assembly and test using a saw or laser process. The interconnects 32 and 38 are electrically continuous until such detachment of the test perimeter 18.

In use, the chip 14 is bonded to the substrate 12 using suitable known bonding techniques such as wire bonding between the chip bonding pads 30 and the inner bonding areas 34. The test pads 40 are patterned in a suitable layout to facilitate electrical connection of the chip to a standard test and/or burn-in module, such as probe card type apparatus, or packaged device testing apparatus. The test pads 40 may be configured in any convenient manner: for example, the standard pin grid array package layout may be used with a square matrix of test pads 40. After testing and burn-in, the outer perimeter is discarded as described, leaving the greatly reduced central area of chip receiving area and interconnect portion as the final "package" area.

Figure 3:
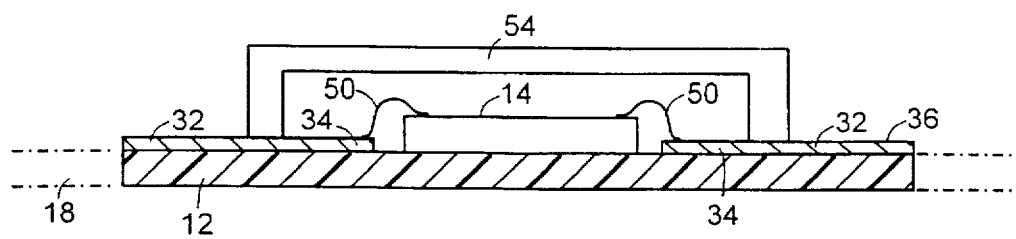
FIG. 3 shows diagrammatically a partial cross-sectional view of the chip carrier of FIG. 2 with hermetic lid attached.

In order to place the testable chip carrier 10 into a form in which full chip protection is achieved, a lid may be applied to the substrate in accordance with various known techniques. With reference to FIG. 3, there is shown a cross-sectional view of such a lid arrangement. Hermetic encapsulation of the chip 14 can be performed by soldering or glass frit sealing a lid 54 over the chip 14, inner bonding areas 34 and wire bonds 50. The interconnects 32 over which the lid 54 is bonded can be protected by deposition of a suitable passivation layer thereover, with appropriate definition of an exposed area at the inner and outer bonding areas 34,36. Non-hermetic encapsulation is also possible with a suitable lidding operation.

Further benefits are realisable with the testable chip carriers described above. Because the deposition and definition process of the interconnects 32,38 on the substrate 12 is a substantially cheaper and more straight-forward operation than that of custom building ceramic packages, the chip carriers are readily matched to any combination of chip design and/or multi-chip module or printed circuit board design. The interconnect portion 16 also occupies substantially less space than the equivalent standard or custom design package. A reduction in overall component size of 17:1 has been achieved in certain cases.

It is also possible using known thick and thin film deposition techniques to create multilevel interconnect portions 16 and test perimeters 18 thereby further increasing packing density. This also allows the use of transmission line type structures to be fabricated (eg. ground planes) with the intention of further improving signal performance at high frequencies. Vias may be formed through the substrate 12 in order to allow electrical connections to pass through to the underside of the chip carrier 10. This facilitates the provision of test pads on the underside of the test perimeter 18, eg. for the creation of the pin grid array pattern previously discussed. It also allows the placement of passive devices on the underside of the chip carrier substrate 12, such as decoupling capacitors. It is a feature of state-of-the-art high current demand chips that rapid switching demands occurring on-chip can cause glitches and spikes on the power supply lines to the chip. These glitches and spikes can be detrimental to other components mounted nearby on the printed circuit board or multi-chip module. The provision of capacitors on the chip carrier substrate 12 would enable power supplies to be regulated.

The choice of substrate 12 may also be made to suit heatsink requirements. This allows the use of common or integral heatsinks for multi-chip assemblies if desired. The heatsink and chip carrier substrate 12 may be of a single piece construction using, for example, poly-silicon. Alternatively, the chip receiving area can be formed as an aperture permitting direct connection of the chip 14 to a heatsink underlying the chip carrier substrate 12, as will be described in greater detail with reference to FIG. 7.

Direct attach of carrier and chip to a common integral heatsink of a multi-chip module gives a better thermal path than prior art arrangements. The approach necessitates chip-through-board technology, and therefore finer line design rules and technology to manifest it. The testable chip carrier thus acts as an interface between the fine line geometries associated with the pitch of bonding pads 30, and the larger geometries associated with external interconnects on PCB or MCM to which the chip is to be attached.

Figure 4:
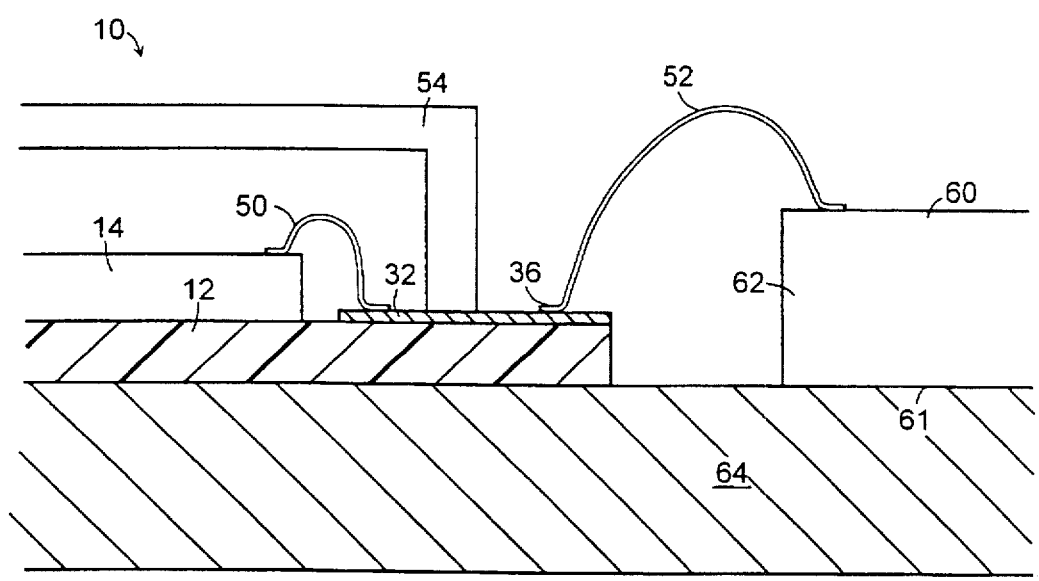
FIG. 4 shows diagrammatically a partial cross-sectional view of the chip carrier of FIG. 2 incorporated into a printed circuit board.

An application of a testable chip carrier 10 to a printed circuit board incorporating suitable heat sinking arrangements is shown in FIG. 4. In this example, the chip carrier includes wire bond connections 50,52 from the chip 14 to the carrier interconnect portion 16, and from the interconnect portion to a PCB 60. An aperture is created in the PCB 60, one edge of which is indicated by reference numeral 62, and a heatsink 64 is attached to the underside 61 of the PCB 60. The chip carrier substrate 12 is attached directly to the heatsink 64, and the wire bonds 52 to the PCB then formed using known techniques. Individual heatsinks may be used, or common heatsinks spanning several chip carriers at different locations on the PCB 60.

The chip 14 to chip carrier 10, and chip carrier 10 to heatsink 64 interfaces are bonded together using a thermally conductive epoxy. The selection of an epoxy with a high modulus of elasticity may also act as an elastic junction to compensate for differential thermal expansions where dissimilar substrate materials are used. It will be recognized that where the chip carrier substrate 12 and heatsink 64 are both chosen from the same material, eg. poly-silicon, very efficient coupling and heat transfer may take place.

The entire assembly of PCB 60, cavity and chip carrier 10 may be potted using an epoxy or silicone compound to create a very low cost encapsulated packaging medium.

Figure 5:
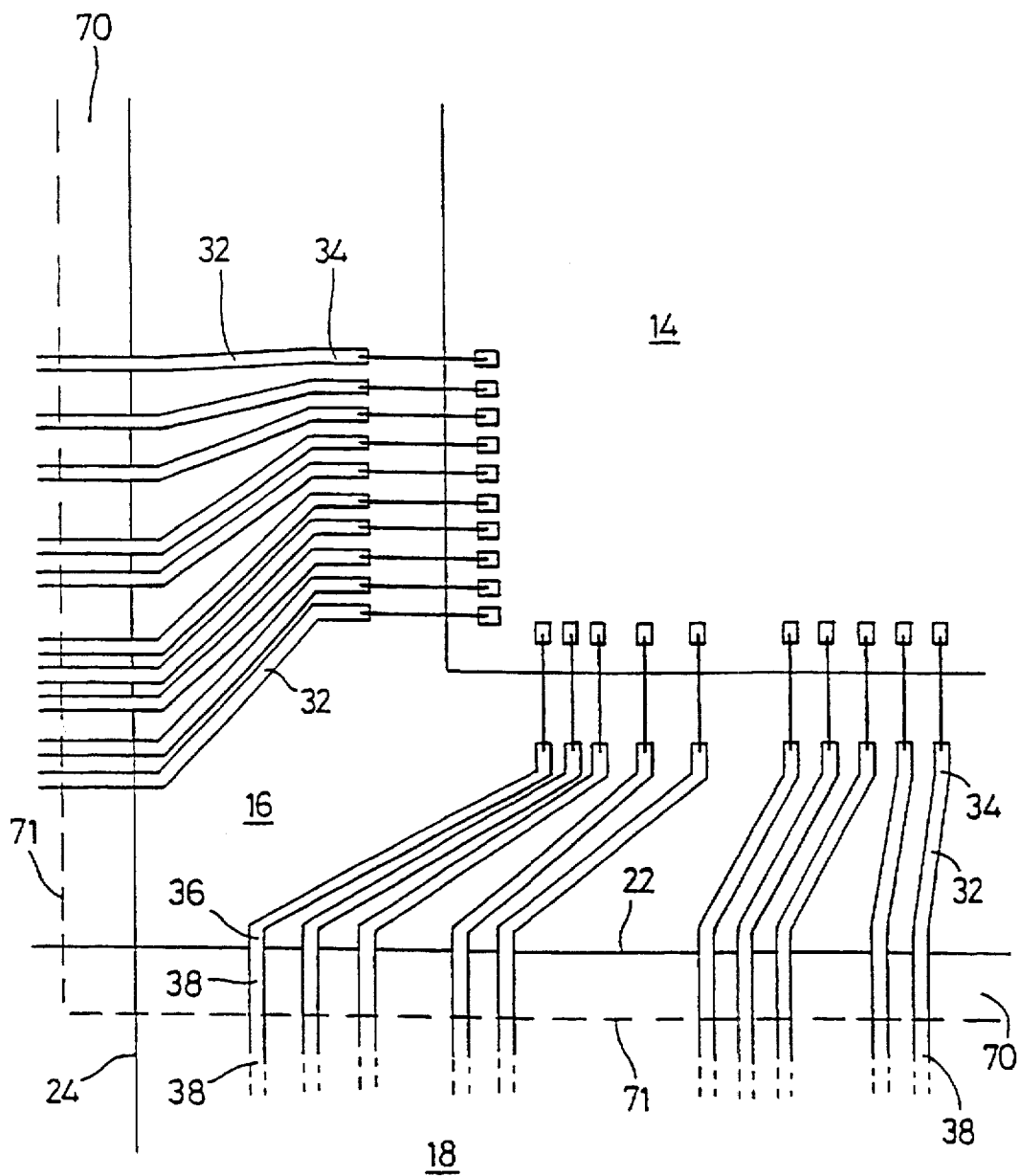
FIG. 5 shows diagrammatically a detailed plan view of the chip carrier of FIG. 1 with a beam lead interconnection facility.

A further embodiment of the invention is now described with reference to FIGS. 5 and 6. With reference to FIG. 5, a portion of a testable chip carrier 10 is shown in plan view. The interconnect elements 32 formed on the interconnect portion 16 include the outer bonding areas 36 which extend orthogonally outward, over the scribe lines 22,24 and into the test perimeter 18 forming the test perimeter interconnects 38. A "detachment portion" of the test perimeter is defined by reference numeral 70. This detachment portion extends outward from the scribe lines 22,24 to an outer edge 71 indicated by the dashed line. In manufacture of the testable chip carrier 10, before the formation of the interconnects 32,38, a coating of low-adhesion powdered compound is deposited on the substrate 12 in the detachment portion 70. The interconnects 32,38 are then deposited and defined. A loss of interconnect 38 adhesion to substrate 12 occurs within the detachment portion 70. After testing of the chip, and before removal of the test perimeter 18, the interconnects 38 are severed along the line of the outer edge 71 using an appropriate cropping tool. When the test perimeter 18 is subsequently detached by snapping the substrate 12 along the scribe lines 22,24, the portion of the interconnects 38 overlying the detachment portion 70 will remain with the chip carrier 10, as extensions to the interconnect elements 32.

Figure 6:
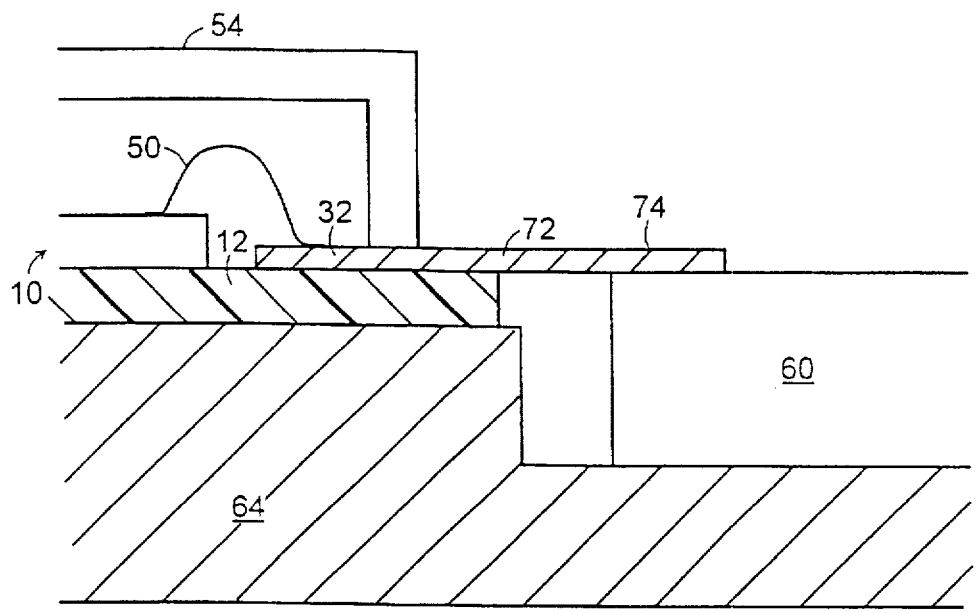
FIG. 6 shows diagrammatically a partial cross-sectional view of the beam lead interconnection of a chip carrier attached to a printed circuit board.

With reference to FIG. 6, these extensions act as beam lead interconnects 72 for subsequent connection to a printed circuit board 60 or multi-chip module in place of the wire bonding procedures previously described. The cantilevered end 74 of the beam lead 72 is bonded directly to contacts on the PCB 60 using either ultra-sonic/thermo-compression bonding, adhesive and soldering techniques or the like. In the embodiment shown, the testable chip carrier 10 is mounted on a heatsink 64 attached to the underside of the PCB 60 in similar manner to that previously described with reference to FIG. 4.

Figure 7A:
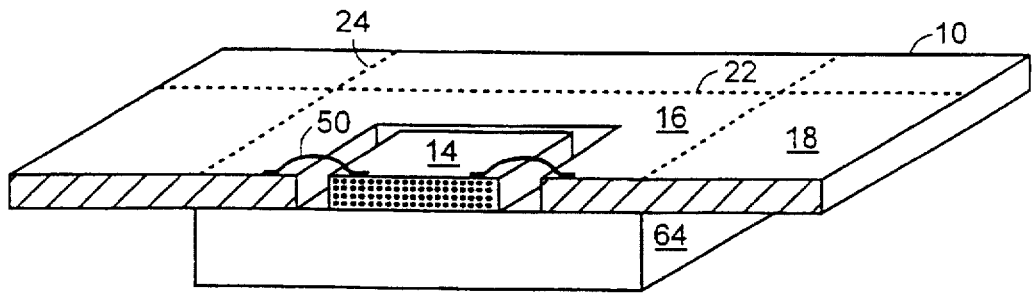
FIGS. 7(a)–7(b) show a testable chip carrier having an aperture for chip attach direct to a thermal slug or heatsink.
Figure 7B:
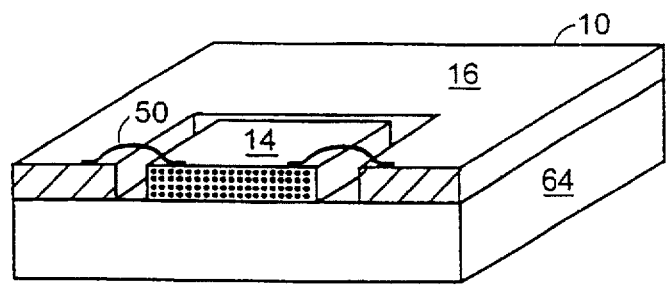

The testable chip carrier may also be modified to allow direct mounting of the chip on an underlying heatsink. Referring to FIG. 7, such an arrangement is shown. FIG. 7a shows the device before removal of the test perimeter 18, and FIG. 7b shows the device after removal of the test perimeter. A chip 14 is mounted directly onto the thermal slug or heatsink 64, together with the testable chip carrier 10. The chip receiving area in this case is an aperture in the substrate 12 of sufficient size to accommodate the chip 14, ie. the heatsink acts as the mechanical chip support. The interconnect portion 16 is designed to cover the heatsink 64, and the testable perimeter 18 extends outward beyond the edges of the heatsink, scribe lines 22,24 approximately coinciding with the edges of the heatsink. Chip 14 is wire bonded with wires 50 to inner bonding areas on the interconnect portion 16 as previously described. In this arrangement, an improved thermal path is effected. The chip, testable chip carrier and thermal slug can be manufactured from thermally similar materials, eg. silicon.

Figure 8:
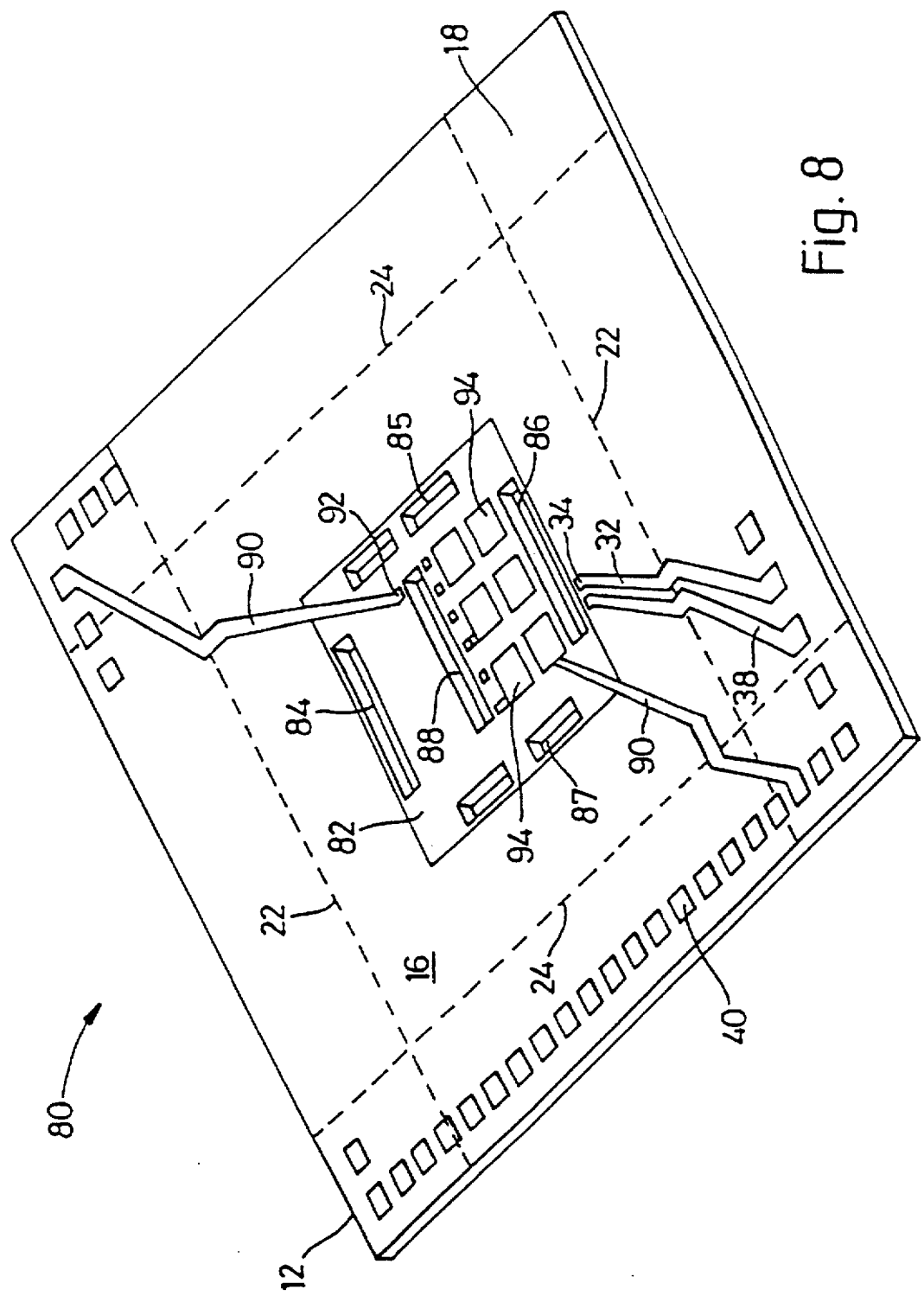
FIG. 8 shows diagrammatically a perspective view of a testable chip carrier according to a further embodiment.
Figure 9:
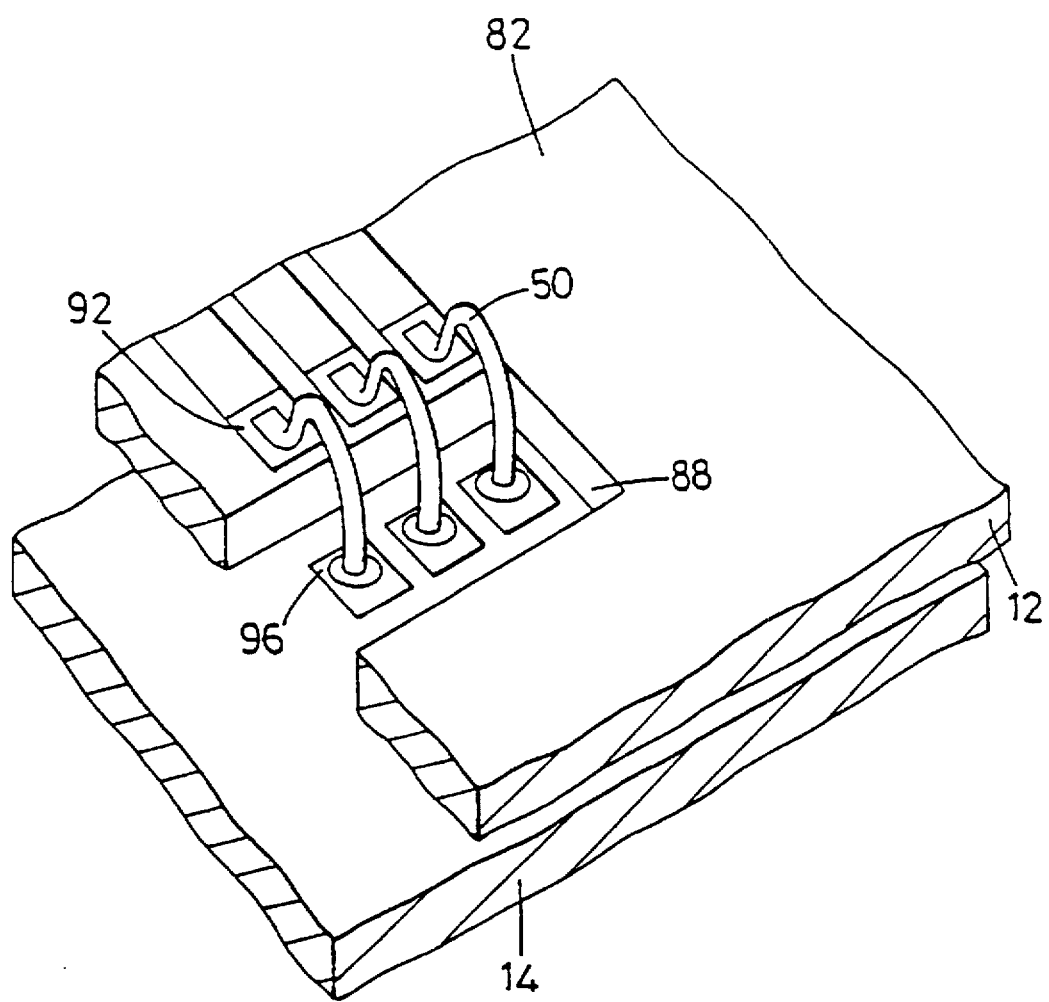
FIG. 9 shows in greater detail a perspective view of a part of the chip carrier of FIG. 8.

With reference to FIGS. 8 and 9, a testable carrier according to a further embodiment of the present invention is shown, in which connection to bonding pads situated on the chip in positions other than at the periphery thereof are accommodated. This may be described as area bonding capability, contrasted with the periphery bonding capabilities already described. The short, equal length bonding wires are maintained even for chips including centrally positioned bonding pads.

A testable chip carrier 80 comprises substrate 12, similarly divided into three portions: a chip receiving area 82, interconnect portion 16 and a test perimeter 18. Scribe lines 22, 24 separate the interconnect portion 16 and test perimeter 18 as previously described, and other features associated with the interconnect portion and the test perimeter are as described with reference to FIGS. 1 and 2. However, within the chip receiving area 82 a continuation of substrate 12 is provided, which includes apertures 84–88 cut therethrough at locations corresponding to the positions of bonding pads on a chip which will be attached beneath the carrier 80, with its passivation layer bonded to the underside of the carrier 80. Apertures 84–87 are used for peripheral bonding pads (eg. corresponding to pads 30,31 of FIG. 2), while aperture 88 is provided for centrally positioned bonding pads, such as those commonly found on memory chips. Interconnects 90 are also provided to inner bonding areas 92 which are located in the chip receiving area 82. The extension of the substrate 12 into the chip receiving area also facilitates the provision of decoupling capacitor structures 94 thereon which are in very close proximity to the inner bonding areas 92. Similar to that previously described, ground plane structures may also be included in the chip receiving area 82.

FIG. 9 shows in greater detail the wire bonding arrangements of the chip carrier 80 of FIG. 8. Chip 14 is located beneath the chip receiving area 82 of substrate 12. Inner bonding areas 92 are located adjacent to aperture 88, and wire bonds 50, all of substantially equal length are provided to chip bond pads 96. The wire bonds may be provided in varying diameters according to whether they provide signal or power connections.

It will be understood that heatsinking arrangements direct to the underside of the chip 14 may be made in similar manner to that already described, and that the carrier substrate 12 will ideally be thermally matched with the chip (eg. by using a silicon substrate), with the wire bonds capable of accommodating any thermal mismatch.

The area bonding technique of this embodiment offers a replacement to flip-chip type interconnection strategies, but with several advantages such as direct chip-to-heatsink attachment and easier inspection of interconnections.

We claim:

1. A chip carrier comprising a rigid substrate, at least a first surface thereof being electrically insulating, the planar area of the substrate being divided into three portions:

the first portion adapted for the siting of an integrated circuit chip, the chip having a plurality of bonding pads for electrical connections to the chip;

the second portion bounding said first portion and having a first plurality of conductive traces formed on said first surface thereof;

the third portion bounding said second portion and having a second plurality of conductive traces formed on a first surface thereof, the first conductive traces being electrically connected to corresponding traces of the second plurality of traces in the third portion;

the first conductive traces each terminating, at one end thereof, at inner bonding areas, and fanning out from the inner bonding areas to terminate, at the other end thereof, at outer bonding areas at the outer periphery of the second portion;

characterized by the inner bonding areas being positioned on the substrate within the first portion or at the inner periphery of the second portion, at positions orthogonally projected outward from each bonding pad of the chip in the plane of the substrate thereby resulting in a substantially identical distance from each bonding pad of a chip sited in said first portion to a corresponding inner bonding area.

2. A chip carrier according to claim 1 wherein the outer bonding areas are positioned on the substrate at positions orthogonally projected inward from a plurality of corresponding connections of an external structure upon which the first and second portions are to be placed for electrical connection to the outer bonding areas resulting in a second substantially identical distance from each outer bonding area to its corresponding connection on the external structure.

3. A chip carrier according to claim 1, wherein each of the second conductive traces terminate, at one end, the electrical connections with the respective first conductive traces, and at the other end terminate at a predetermined contact position, the third portion being detachable from the second portion.

4. A chip carrier according to claim 2 wherein the external structure is a printed circuit board.

5. A chip carrier according to claim 2 wherein the external structure is a multi-chip module.

6. A chip carrier according to claim 3 wherein the third portion has discrete passive components mounted thereon, electrically connected to selected ones of the plurality of second traces.

7. A chip carrier according to claim 6 wherein the third portion has vias cut therethrough from the first surface to a second surface thereof, the second surface being provided with predetermined contact positions for electrical connection to selected ones of the second plurality of traces.

8. A chip carrier according to claim 1 wherein the second portion has discrete passive components mounted thereon, electrically connected to selected ones of the plurality of first traces.

9. A chip carrier according to claim 1 wherein the first portion has discrete passive components mounted thereon, electrically connected to selected ones of the plurality of first traces.

10. A chip carrier according to claim 8 wherein the second portion has vias cut therethrough from the first surface to a second surface thereof, the second surface being used for the mounting of the discrete passive components.

11. A chip carrier according to claim 3 wherein the predetermined contact positions of the second traces emulate pin positions of a standard chip package.

12. A chip carrier according to claim 1 wherein said substrate is constructed from a ceramic material.

13. A chip carrier according to claim 12 wherein said substrate is constructed from one of aluminium nitride, silicon dioxide, beryllium oxide or poly-silicon.

14. A chip carrier according to claim 1 wherein at least a part of the substrate is fabricated with an integral heatsink.

15. A chip carrier according to claim 3 wherein the outer bonding areas are formed as beam lead interconnections, the first plurality of conductive traces extending beyond the outer periphery of the first portion upon detachment of the third portion.

16. A chip carrier according to claim 1 wherein the first portion comprises a recess or void in the substrate into which the chip may be inserted.

17. A chip carrier according to claim 1 wherein the first conductive traces are patterned so as to act as impedance matching connections between the chip and the external structure.

18. A chip carrier according to claim 1 wherein the first conductive traces are patterned with a uniform track spacing and/or pitch.

* * * * *